(12) United States Patent  
Kao et al.

(10) Patent No.: US 9,881,787 B2  
(45) Date of Patent: Jan. 30, 2018

(54) DEPOSITION METHODS FOR UNIFORM AND CONFORMAL HYBRID TITANIUM OXIDE FILMS

(71) Applicant: Applied Materials, Inc., Santa Clara, CA (US)

(72) Inventors: Chien-Teh Kao, Sunnyvale, CA (US); Benjamin Schmiege, Santa Clara, CA (US); Xuesong Lu, San Jose, CA (US); Juno Yu-Ting Huang, Sunnyvale, CA (US); Yu Lei, Belmont, CA (US); Yung-Hsin Lee, Sunnyvale, CA (US); Srinivas Gandikota, Santa Clara, CA (US); Rajkumar Jakkaraju, San Jose, CA (US); Chikuang Charles Wang, San Jose, CA (US); Ghazal Saheli, Campbell, CA (US); Benjamin C. Wang, Santa Clara, CA (US); Xinliang Lu, Fremont, CA (US); Pingyan Lei, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/184,521

(22) Filed: Jun. 16, 2016

(65) Prior Publication Data

US 2016/0372324 A1 Dec. 22, 2016

Related U.S. Application Data

(60) Provisional application No. 62/181,445, filed on Jun. 18, 2015.

(51) Int. Cl.  
*H01L 21/02* (2006.01)  
*H01L 21/311* (2006.01)

(52) U.S. Cl.  
CPC .. H01L 21/02186 (2013.01); H01L 21/31144 (2013.01); *H01L 21/0228* (2013.01); *H01L 21/02274* (2013.01)

(58) Field of Classification Search  
CPC ......... H01L 21/02186; H01L 21/31144; H01L 21/0228; H01L 21/02274  
See application file for complete search history.

(56) References Cited

U.S. PATENT DOCUMENTS

| | | | |
|---|---|---|---|
| 4,605,947 | A | 8/1986 | Price et al. |
| 5,759,916 | A | 6/1998 | Hsu et al. |
| 5,972,178 | A | 10/1999 | Narasimhan et al. |
| 6,130,155 | A | 10/2000 | Chen et al. |
| 6,466,124 | B1 | 10/2002 | Shibuya et al. |

(Continued)

FOREIGN PATENT DOCUMENTS

EP 0791663 B1 1/2001

OTHER PUBLICATIONS

PCT International Search Report and Written Opinion in PCT/US2016/037860 dated Sep. 27, 2016, 14 pages.

*Primary Examiner* — Selim Ahmed  
(74) *Attorney, Agent, or Firm* — Servilla Whitney LLC

(57) ABSTRACT

Methods for depositing titanium oxide films by atomic layer deposition are disclosed. Titanium oxide films may include a titanium nitride cap, an oxygen rich titanium nitride cap or a mixed oxide nitride layer. Also described are methods for self-aligned double patterning including titanium oxide spacer films.

12 Claims, 1 Drawing Sheet

(56) References Cited

U.S. PATENT DOCUMENTS

| | | |
|---|---|---|
| 8,518,486 B2 | 8/2013 | Mirin et al. |
| 2001/0018257 A1 | 8/2001 | Mathews |
| 2002/0146915 A1 | 10/2002 | Narwanker et al. |
| 2004/0266217 A1 | 12/2004 | Kim et al. |
| 2006/0099760 A1 | 5/2006 | Kim et al. |
| 2006/0228868 A1 | 10/2006 | Ahn et al. |
| 2012/0064689 A1* | 3/2012 | Hirota .............. H01L 21/02178 438/381 |
| 2014/0242810 A1* | 8/2014 | Takano ............. H01L 21/02282 438/782 |
| 2015/0099072 A1* | 4/2015 | Takamure ............... C23C 16/34 427/577 |
| 2015/0118850 A1 | 4/2015 | Peng et al. |
| 2015/0228496 A1 | 8/2015 | Nakano |

* cited by examiner

DEPOSITION METHODS FOR UNIFORM AND CONFORMAL HYBRID TITANIUM OXIDE FILMS

CROSS-REFERENCE TO RELATED APPLICATIONS

This application claims priority to U.S. Provisional Application No. 62/181,445, filed Jun. 18, 2015, the entire disclosure of which is hereby incorporated by reference herein.

FIELD

Embodiments of the present disclosure generally relate to an apparatus for processing substrates. More particularly, the disclosure relates to self-aligned double patterning processing and a batch processing platform for performing same.

BACKGROUND

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming a copper diffusion barrier layer conformally onto the surface of a high aspect ratio, 65 nm or smaller interconnect feature, use an ALD process may be beneficial. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form a uniform material layer on the surface of a substrate. Cycles of reactive precursor and inert purge gases are repeated to form the material layer to a predetermined thickness.

There is an ongoing need in the art for titanium films and methods of depositing titanium films on a substrate.

SUMMARY

Some embodiments of the disclosure are directed to methods for forming a TiO film. A substrate surface is sequentially exposed to a first titanium-containing precursor and an oxygen-containing reactant to form an initial TiO film with a thickness in the range of about 80% to about 99% of a predetermined thickness of the TiO film. The initial TiO film is sequentially exposed to a second titanium-containing precursor and a nitrogen-containing reactant to form a TiN capped TiO film with the predetermined thickness. In one or more embodiments, the method includes soaking the TiN capped TiO film with an oxygen-containing reactant to passivate or convert a top of the TiN capped TiO film to an oxygen-rich film.

Additional embodiments of the disclosure are directed to methods of forming a TiO film. A substrate surface is sequentially exposing to a first titanium-containing precursor and a mixture of an oxygen-containing reactant and a nitrogen-containing reactant having an O:N ratio greater than 1:1 to form a nitrogen-doped TiO film having a predetermined thickness.

Further embodiments of the disclosure are directed to titanium oxide films having a substantially amorphous morphology, a refractive index greater than about 2.0, an average surface roughness ($R_a$) by AFM of less than about 5 Å, a stress less than or equal to about 300 MPa and a wet etch rate less than or equal to about 15 Å/min in dilute HF.

Additional embodiments of the disclosure are directed to processing methods. A substrate with a first layer comprising a dielectric and a patterned layer thereon is provided. Portions of the first layer exposed through the patterned layer. The patterned layer comprises at least one feature having a top surface and a two vertical faces defining a width. The vertical faces are substantially perpendicular to the first layer. A TiO spacer layer is deposited over the first layer and patterned layer so that the spacer layer forms a film on the portions of the first layer exposed through the patterned layer, the top surface and both vertical faces of the at least one feature. The TiO spacer layer is deposited by sequentially exposing the substrate to a first titanium-containing precursor and an oxygen-containing reactant to a thickness in the range of about 80% to about 99% of a predetermined thickness to form a TiO film. The TiO film is sequentially exposed to a second titanium-containing precursor and a nitrogen-containing reactant to form a TiN capped TiO film having the predetermined thickness. Optionally, the TiN capped TiO film is soaked with an oxygen-containing reactant to passivate or convert a top of the TiN capped TiO film to an oxygen-rich film. The spacer layer is etched from the top surface of the at least one feature and the portions of the first layer exposed through the patterned layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. The appended drawings illustrate only typical embodiments of this disclosure and are therefore not to be considered limiting, for the disclosure may admit to other equally effective embodiments.

DETAILED DESCRIPTION

Figure 1A:
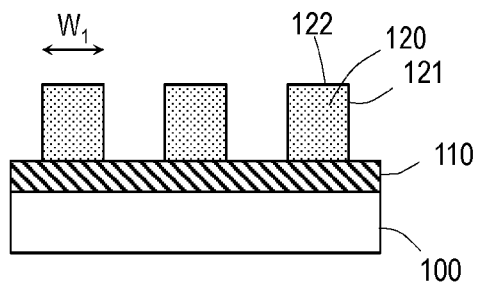
FIGS. 1A-1F show an illustration of a self-aligned double patterning process in accordance with one or more embodiment of the disclosure.

Embodiments of the disclosure provide deposition methods with atomic layer deposition (ALD) techniques to grow hybrid titanium oxide films under process conditions to provide films with properties useful for semiconductor device manufacturing. The process conditions of some embodiments use low thermal budget for the entire process sequence; the process temperature of some embodiments to generate the film is <400° C. The resulting film can be highly uniform across the substrate and conformal over the device morphology. In some embodiments, film properties include (i) high refractive index close to the intrinsic $TiO_2$ index (n~2.5), (ii) smooth film surface, (iii) low stress near neutral, and (iv) low wet etch rate by diluted HF for high etch selectivity over $SiO_2$.

In some embodiments, the deposition temperature is maintained near or below decomposition temperatures of the process precursors and $TiO_2$ crystallization temperature (~300° C.) from amorphous phase. Some embodiments of the disclosure form TiN capped $TiO_2$ films. An ALD process with cycles of alternating exposure steps of a Ti-containing precursor and an O-containing reactant, separated with purge step in between exposure steps of different reactants, to grow a $TiO_2$ film to >80% of the desired film thickness; followed by an ALD process with cycles of alternating exposure steps of a Ti-containing precursor and an N-containing reactant, separated with purge step in between exposure steps of different reactants, to grow the top layer of TiN to <20% of the desired film thickness.

Additional embodiments of the disclosure form an oxygen-rich TiN capped $TiO_2$ film. An ALD process with cycles of alternating exposure steps of a Ti-containing precursor and an O-containing reactant, separated with a purge step in between exposure steps of different reactants, to grow a $TiO_2$ film to >80% of the desired film thickness; followed by ALD process with cycles of alternating exposure steps of a Ti-containing precursor and an N-containing reactant, separated with a purge step in between exposure steps of different reactants, to grow the top layer of TiN to <20% of the desired film thickness. This is followed by soaking the complete film with O-containing reactant to passivate or convert the top TiN layer to be O-rich.

Further embodiments form N-doped $TiO_2$ films. An ALD process with cycles of alternating exposure steps of a Ti-containing precursor and a mixture of an O-containing reactant (majority) and an N-containing reactant (minority), separated with a purge step in between exposure steps of different reactants, to grow an N-doped $TiO_2$ film for the entire film thickness. The N-content in the film is controlled by the ratio between the O-containing reactant and the N-containing reactant in the mixture.

In some embodiments, a process temperature <250° C. yields amorphous film, hence, smooth film surface. Higher film density results in lower wet etch rate. In bulk crystalline structure, density of TiN (5.22 gram/cm$^3$) is notably higher than that of the most common $TiO_2$ forms, anatase (3.78 gram/cm$^3$) and rutile (4.23 gram/cm$^3$). Annealing an amorphous film at a higher temperature (e.g., >300° C.) may increase the film density, leading to lower wet etch rate by diluted HF as desired, film surface may also become rougher and film stress may be higher, both of which may not be as useful. In some embodiments, higher N content in the film has lower wet etch rate.

In one or more embodiments of the disclosure, the method for hybrid $TiO_2$ film deposition show (1) a low process temperature near or below the precursor decomposition temperature that ensures a real ALD process to produce highly uniform and conformal films with precisely controlled thickness; (2) the ALD process temperature below $TiO_2$ crystalline temperature (<300° C.) may result in amorphous films with low stress and smooth surface morphology; (3) adjusting N content either in the top layer of the hybrid $TiO_2$ film or the entire film, the wet etch rate of the resulting $TiO_2$ film can be reduced to the desired level to provide adequate etch selectivity over $SiO_2$; and/or (4) with TiO2 as the major component of the hybrid film, high refractive index close that of $TiO_2$ film (n>2 or higher) may be attained.

As used in this specification and the appended claims, the term "substrate" and "wafer" are used interchangeably, both referring to a surface, or portion of a surface, upon which a process acts. Those skilled in the art will understand that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive in an atomic layer deposition process. For example, a first "reactive gas" may simply adsorb onto the surface of a substrate and be available for further chemical reaction with a second reactive gas.

Substrates for use with the embodiments of the disclosure can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire or silicon carbide.

One or more embodiments of the disclosure are directed to methods for forming a titanium oxide film. The terms "titanium oxide", "TiO", "titanium dioxide", "$TiO_2$", "titanium nitride", "TiN", and the like, are used to describe a material that has titanium and oxygen or nitrogen and does not imply stoichiometric amounts. A substrate surface is sequentially exposed to a first titanium-containing precursor and an oxygen-containing reactant to form an initial TiO film. Sequential exposure means that the substrate surface is exposed to only one of the named components at a time without gas phase reactions to maintain an atomic layer deposition process.

The TiO film deposited can have any suitable thickness. In some embodiments, the total thickness of the TiO film is less than about 500 Å, 450 Å, 400 Å, 350 Å, 300 Å or 250 Å. The minimum thickness of the TiO film can be at least about 10 Å, 12.5 Å, 15 Å, 17.5 Å or 20 Å.

In some embodiments, the initial TiO film is deposited to a thickness in the range of about 80% to about 99% of a predetermined thickness for the completed TiO film. In some embodiments, the TiO film is deposited to a thickness greater than about 80%, 85%, 90%, 95%, 96%, 97% or 98% of the predetermined thickness of the completed TiO film.

The initial TiO film of some embodiments is then sequentially exposed to a second titanium-containing precursor and a nitrogen-containing reactant to form a TiN capped TiO film. The TiN capped TiO film is a completed TiO film with the predetermined thickness. For example, if the predetermined thickness of the completed TiO film is 100 Å, the initial TiO2 film may be deposited to a thickness of about 80% to about 99% of the 100 Å. The TiN cap is then deposited to a thickness in the range of about 1% to about 20% of the 100 Å.

In some embodiments, the TiN capped TiO film is soaked with an oxygen-containing reactant to passivate or convert a top of the TiN capped TiO film to an oxygen-rich film. The overall thickness of the film can remain the same or change during the oxygen soak. For example, a 100 Å thick TiN capped TiO film that has been soaked with an oxygen-containing reactant may have a final thickness in the range of about 98 Å to about 102 Å.

The first titanium-containing precursor and the second titanium-containing precursor can be the same precursor species or different. For example, the first titanium-containing precursor might be a titanium organometallic complex and the second titanium-containing precursor may comprise a halogenated titanium species. In some embodiments, the first titanium-containing precursor and the second titanium-containing precursor are the same.

In one or more embodiments, a TiO film is formed by sequentially exposing a substrate surface to a first titanium-containing precursor and a mixture of an oxygen-containing reactant and a nitrogen-containing reactant. The mixture of the oxygen-containing reactant and the nitrogen-containing reactant can have an O:N ratio that can be tuned or adjusted to change the properties of the final TiO film. In some embodiments, the mixture has an O:N ratio greater than 1:1. Stated differently, the mixture may be greater than about 50% O relative to the sum of O and N components. In some embodiments, the mixture is greater than about 60%, 70%, 80% or 90% O relative to the sum of O and N components.

The temperature of the deposition process can be varied depending on, for example, the precursors being used. As used in this regard, the process temperature means that each portion of the deposition process occurs at or below the stated temperature. Each portion of the process can occur at a different temperature than other portions of the process. In some embodiments, the process occurs at a temperature less than or equal to about 400° C., 350° C., 300° C. or 250° C.

The titanium-containing precursor can be any suitable titanium precursor. In some embodiments the first titanium-containing precursor and the second titanium-containing precursor are independently selected from the group consisting of tetrakis(dimethylamino)titanium (TDMAT), tetrakis(diethylamino)titanium (TDEAT), titanium isopropoxide (TTIP), $TiCl_4$ $TiBr_4$, $TiI_4$, mixed halides of titanium and combinations thereof.

The oxygen-containing reactant can be any suitable oxygen reactant. In some embodiments, the oxygen-containing reactant is selected from the group consisting of water, $O_2$, $O_3$, plasma-activated $O_2$, nitrogen oxides (e.g., NO, $NO_2$, $N_2O$, etc.) and combinations thereof.

The nitrogen-containing reactant can be any suitable nitrogen reactant. In some embodiments, the nitrogen-containing reactant is selected from the group consisting of ammonia, $NO_2$, $N_2O$, plasma activated $N_2$, plasma activated mixture of $N_2$ and $H_2$, a plasma activated mixture of $N_2$ and $O_2$, nitrogen oxides and combinations thereof.

In some embodiments, the oxygen-containing reactant and the nitrogen-containing reactant are the same reactive species. According to some embodiments, the nitrogen-containing reactant and/or the oxygen-containing reactant is a nitrogen oxide. Non-limiting examples of nitrogen oxides include, NO, $N_2O$, $NO_2$, $N_2O_3$, $N_4O$, $N_2O_4$, $N_2O_5$ and/or $N_4O_6$.

In one or more embodiments, the TiO film formed is substantially amorphous. As used in this regard, the term "substantially amorphous" means that the film is less than about 10%, 9%, 8%, 7%, 6%, 5%, 4%, 3%, 2% or 1% crystalline.

In some embodiments, the TiO film has a refractive index greater than about 2.0. In one or more embodiments, refractive index of the complete TiO film is greater than or equal to about 2.0, 2.1, 2.2, 2.3, 2.4 or 2.5. In one or more embodiments, the completed TiO film has an average surface roughness ($R_a$) by atomic force microscopy (AFM) of less than about 5 Å, 4 Å, 3 Å or 2 Å. In some embodiments, the completed TiO film has a stress less than or equal to about 300 MPa, 250 MPa, 200 MPa or 150 MPa. In some embodiments, the completed TiO film has a wet etch rate less than or equal to about 20 Å/min, 15 Å/min or 10 Å/min in dilute HF (1:100 $HF:H_2O$). in some embodiments, the completed TiO film has a wet etch rate ratio (WERR), vs. silicon oxide, less than or equal to about 0.5, 0.45, 0.4, 0.35 or 0.3 in dilute HF.

Some embodiments of the disclosure are directed to titanium oxide films having a substantially amorphous morphology, a refractive index greater than about 2.0, an average surface roughness ($R_a$) by AFM of less than about 5 Å, a stress less than or equal to about 300 MPa and a wet etch rate less than or equal to about 15 Å/min in dilute HF.

In one or more embodiments, the first and second titanium-containing precursor comprises TDMAT, the oxygen-containing reactant comprises water and the nitrogen-containing reactant comprises ammonia and the deposition temperature is less than about 200° C. The deposition temperature for processes using different titanium-containing precursors that TDMAT might be higher because, for example, the decomposition temperature of the precursor might be higher.

FIGS. 1A through 1F show a typical self-aligned double patterning (SADP) process in accordance with one or more embodiments of the disclosure. The process shown and described can be performed with any suitable oxides, nitrides, dielectrics, photoresists and/or metal layers. In FIG. 1A, a substrate 100 is layered with a dielectric 110 and patterned with a photoresist 120. Although dielectric 110 is shown deposited on the substrate 100 with a photoresist 120 thereon, those skilled in the art will understand that there can be intervening layers between the substrate 100 and the dielectric 110, or layers between the dielectric 110 and the photoresist 120. Additionally, the dielectric 110 layer can be a different material (e.g., a metal layer).

Figure 1B:
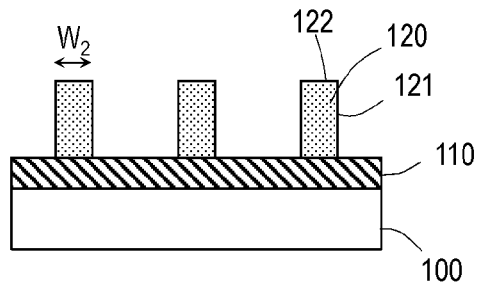

As shown in FIG. 1B, the photoresist 120 can be exposed to a plasma to etch the sides 121 of the photoresist. By etching the sides of the photoresist 120, the width of the photoresist is decreased resulting in a slimmer photoresist and a larger area of dielectric 110 exposed. This process is referred to as photoresist slimming or PR slimming.

Figure 1C:
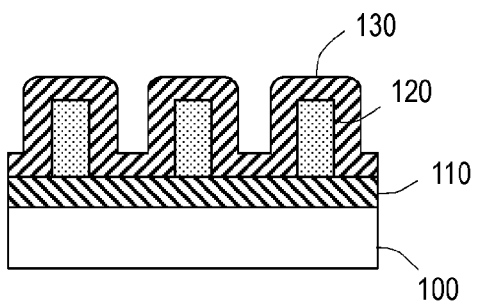

As shown in FIG. 1C, a spacer film 130 is deposited over the exposed surface of the dielectric 110 and the photoresist 120 so that the top 122 and sides 121 of the photoresist 120 are conformally coated with the spacer film 130. The spacer film can be made from any suitable material including, but not limited to, an oxide film.

Figure 1D:
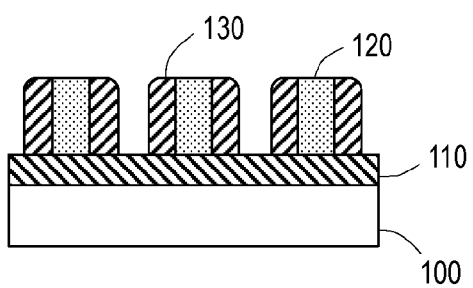
Figure 1E:
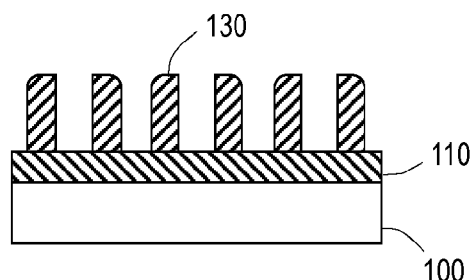

In FIG. 1D, the spacer film 130 has been etched from horizontal surfaces. This means that the top 122 of the photoresist 120 is exposed and part of the dielectric 110 surface is exposed. In FIG. 1E, the original patterned photoresist 120 is etched away, leaving only what is left of spacer film 130. The substrate 100 can be etched using the spacers as a guide, and the remaining dielectric 110 and spacer film 130 stripped to provide the etched substrate 100 in FIG. 1F. The selectivity between the films described herein, such as the dielectric, allows for this process to be carried out. If there is insufficient selectivity, a cap, such as SiON, can be placed on the photoresist prior to the deposition of the spacer film. These caps prevent unintentionally etching away patterned photoresist.

Accordingly, with reference to FIGS. 1A to 1F, one or more embodiments of the disclosure are directed to processing methods. A substrate 100 is provided which has a first layer, which may be dielectric 110, and a patterned layer, which may be photoresist 120. Although the first layer does not need to be a dielectric and the patterned layer does not need to be a photoresist, these terms are used for convenience of description. Portions of the first layer are exposed through the patterned layer so that when looking down at the substrate, both the first layer and the patterned layer are visible at the same time.

The patterned layer comprises at least one feature having a top 122 and two sides 121 (i.e., the vertical faces) defining a width $W_1$. The width $W_1$ can be any suitable width for a patterned layer. In some embodiments, the width of the at least one feature is in the range of about 200 Å to about 800 Å, or in the range of about 300 Å to about 700 Å or in the range of about 400 Å to about 600 Å.

The feature or features present on the substrate can be made by any suitable technique and may be formed prior to placing the substrate within the processing chamber. In some embodiments, the features are formed within the same processing chamber and the SADP processing. The features can be any suitable size and any suitable aspect ratio. In some embodiments the aspect ratio of the feature is greater than about 1:1, 2:1, 3:1, 4:1 or 5:1. In some embodiments, the feature has an aspect ratio in the range of about 1:1 to about 20:1, or in the range of about 2:1 to about 15:1, or in the range of about 3:1 to about 10:1, or in the range of about 4:1 to about 8:1.

The vertical faces 121 of the feature are substantially perpendicular to the first layer. As used in this specification and the appended claims, the term "substantially perpendicular" means that the vertical faces form an angle relative to the first layer in the range of about 80° to about 100°, or in the range of about 85° to about 95°, or in the range of about 88° to about 92°.

The patterned layer can be any suitable material depending on the use of the patterned layer. In the example shown in FIGS. 1A through 1F, a self-aligned double patterning procedure is described in which the patterned layer is one or more of a photoresist or spin-on-carbon.

The patterned layer (e.g., photoresist 120) is exposed to processing conditions to reduce the width of the patterned layer from $W_1$ to $W_2$. Accordingly, width $W_2$ is less than width $W_1$. In some embodiments, to reduce the width of the patterned layer, trimming is done by exposing the patterned layer to a plasma. The plasma can be any suitable plasma including, but not limited to, hydrogen, nitrogen, oxygen, argon, carbon dioxide and helium. In some embodiments, the patterned layer comprises spin-on-carbon and the plasma comprises argon and carbon dioxide.

The amount of material removed from the sides of the feature can be controlled by the amount of exposure to the plasma. In some embodiments, the patterned layer width is reduced by an amount in the range of about 10 Å to about 200 Å, or in the range of about 20 Å to about 150 Å, or in the range of about 30 Å to about 100 Å. In one or more embodiments, the patterned layer width is reduced by an amount greater than about 10%, 15%, 20%, 25%, 30%, 35%, 40%, 45% or 50% of the initial width. The width of the feature has been slimmed while not being reduced to zero, meaning that there is some usable feature remaining. After trimming the feature, the vertical faces remain substantially perpendicular to the first layer.

Referring to FIG. 1C, a spacer layer (e.g., an oxide film 130) is deposited over the first layer and patterned layer so that the spacer layer forms a film on the portions of the first layer exposed through the patterned layer, the top surface and both vertical faces of the at least one feature. The spacer layer deposited can be substantially conformal, meaning that the thickness of the spacer layer is uniform across the horizontal and vertical surfaces. As used in this specification and the appended claims, the term "substantially conformal" means that the thickness of the film does not vary by more than about 20%, 15%, 10% or 5% relative to the average film thickness. The spacer layer can be made from any suitable material including, but not limited to, oxides, nitrides, silicides, oxynitrides, carbonitrides and combinations thereof.

Referring to FIG. 1D, the spacer layer is etched from the horizontal surfaces, leaving the spacer layer on the vertical faces. Here, the top surface of the feature and the horizontal portions between features is etched, exposing the top surface of the feature and first layer.

The individual processes can be performed in separate processing chambers or a single processing chamber as described herein. In some embodiments, each process occurs in a single processing chamber in which the substrate is moved laterally between a plurality of sections, each section separated from adjacent sections by a gas curtain. In embodiments of this sort, trimming the patterned layer occurs in a first section of the processing chamber, depositing the spacer layer occurs in a second section of the processing chamber and etching the spacer layer occurs in a third section of the processing chamber. For example, a processing method of this sort can comprise placing the substrate into a processing chamber comprising a plurality of sections, each section separated from adjacent sections by a gas curtain. At least a portion of the substrate is exposed to a first process condition to trim the patterned layer to reduce the width of the patterned layer. The substrate is laterally moved through a gas curtain to a second section of the processing chamber. In the second section of the processing chamber, at least a portion of the substrate is exposed to a second process condition to deposit the spacer layer over the first layer and the patterned layer. The substrate is then laterally moved through a gas curtain to a third section of the processing chamber. At least a portion of the substrate is then exposed to a third process condition to etch the spacer layer from the top surface of the at least one feature and the portions of the first layer exposed through the patterned layer. During lateral movement of the substrate from the first section to the second section, a first portion of the substrate is exposed to the first process condition at the same time that a second portion of the surface is exposed to the second process conditions and an intermediate portion of the substrate is exposed to the gas curtain. The intermediate portion being some portion of the substrate between the first portion and the second portion. During lateral movement of the substrate from the second section to the third section, a first portion of the substrate is exposed to the second process condition at the same time that a second portion of the substrate is exposed to the third process condition and an intermediate portion of the substrate is exposed to the gas curtain.

Figure 1F:
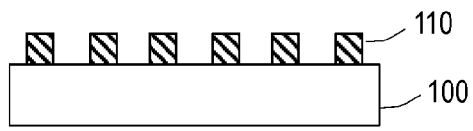

FIGS. 1E and 1F show additional process stages which may be performed in the same processing chamber or different environments. In FIG. 1E, the patterned layer is removed. This process may be referred to as "core removal" and is often, but not required to be, done by wet chemical methods. In FIG. 1F, the remaining spacer layer and exposed portions of the first layer are etched away from the substrate.

Accordingly, one or more embodiments of the disclosure are directed to processing method comprising providing a substrate with a first layer comprising a dielectric and a patterned layer thereon, where portions of the first layer are exposed through the patterned layer and the patterned layer comprises at least one feature having a top surface and a two vertical faces defining a width. The vertical faces of the at least one feature are substantially perpendicular to the first layer. As used in this regard, the term "substantially perpendicular" means that the angle relative to the first layer is in the range of about 80° to about 100°, or in the range of about 85° to about 95°. A TiO spacer layer is deposited over the first layer and the patterned layer so that the spacer layer forms a film on the portions of the first layer exposed through the patterned layer, the top surface and both vertical faces of the at least one feature. The TiO spacer layer may be deposited by sequentially exposing the substrate to a first titanium-containing precursor and an oxygen-containing reactant to a thickness in the range of about 80% to about 99% of a predetermined thickness to form an initial TiO. The initial TiO film is sequentially exposed to a second titanium-containing precursor and a nitrogen-containing reactant to form a TiN capped TiO film having the predetermined thickness. Optionally, the TiN capped TiO film is soaked with an oxygen-containing reactant to passivate or convert a top of the TiN capped TiO film to an oxygen-rich film. The spacer layer is then etched from the top surface of the at least one feature and the portions of the first layer are exposed through the patterned layer.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz, as well as in the GHz range, such as 2.45 GHz for the most common microwave generator. Although plasmas may be used during the deposition processes disclosed herein, plasmas may not be required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific portions of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A method of forming a TiO film, the method comprising:
   sequentially exposing a substrate surface to a first titanium-containing precursor and an oxygen-containing reactant to form an initial TiO film with a thickness in the range of about 80% to about 99% of a predetermined thickness of the TiO film; and
   sequentially exposing the initial TiO film to a second titanium-containing precursor and a nitrogen-containing reactant to form a TiN capped TiO film with the predetermined thickness.

2. The method of claim 1, further comprising soaking TiN capped TiO film with an oxygen-containing reactant to passivate or convert a top of the TiN capped TiO film to an oxygen-rich film.

3. The method of claim 1, wherein the first titanium-containing precursor and the second titanium-containing precursor are the same.

4. The method of claim 1, wherein the predetermined thickness is greater than about 10 Å.

5. The method of claim 4, wherein the predetermined thickness is greater than about 15 Å.

6. The method of claim 1, wherein the predetermined thickness is up to about 400 Å.

7. The method of claim 1, wherein the method occurs at a temperature less than about 400° C.

8. The method of claim 1, wherein the first titanium-containing precursor and the second titanium-containing precursor are independently selected from the group consisting of TDMAT, TDEAT, TTIP, $TiCl_4$, $TiBr_4$, $TiI_4$, mixed halides of titanium and combinations thereof.

9. The method of claim 1, wherein the oxygen-containing reactant is selected from the group consisting of water, $O_2$, $O_3$, plasma-activated $O_2$ and combinations thereof.

10. The method of claim 1, wherein the nitrogen-containing reactant is selected from the group consisting of ammonia, $NO_2$, $N_2O$, plasma activated $N_2$, plasma activated mixture of $N_2$ and $H_2$, a plasma activated mixture of $N_2$ and $O_2$, and combinations thereof.

11. The method of claim 1, wherein the TiO film is substantially amorphous.

12. A processing method comprising:
   providing a substrate with a first layer comprising a dielectric and a patterned layer thereon, portions of the first layer exposed through the patterned layer, the patterned layer comprising at least one feature having a top surface and a two vertical faces defining a width, the vertical faces substantially perpendicular to the first layer;
   depositing a TiO spacer layer over the first layer and patterned layer so that the spacer layer forms a film on the portions of the first layer exposed through the patterned layer, the top surface and both vertical faces of the at least one feature, the TiO spacer layer deposited by sequentially exposing the substrate to a first titanium-containing precursor and an oxygen-containing reactant to a thickness in the range of about 80% to about 99% of a predetermined thickness to form a TiO film followed by sequentially exposing the TiO film to a second titanium-containing precursor and a nitrogen-containing reactant to form a TiN capped TiO film having the predetermined thickness and, optionally, further comprising soaking the TiN capped TiO film with an oxygen-containing reactant to passivate or convert a top of the TiN capped TiO film to an oxygen-rich film; and
   etching the spacer layer from the top surface of the at least one feature and the portions of the first layer exposed through the patterned layer.

* * * * *